(12) United States Patent
Kim et al.

(10) Patent No.: US 8,791,454 B2
(45) Date of Patent: Jul. 29, 2014

(54) ORGANIC LIGHT EMITTING DIODE DEVICE AND METHOD OF MANUFACTURING THE SAME

(71) Applicant: LG Display Co., Ltd., Seoul (KR)

(72) Inventors: Hwakyung Kim, Gimpo-si (KR);
Byungchul Ahn, Seoul (KR);
Changwook Han, Seoul (KR);
Hongseok Choi, Seoul (KR); Sunghoon Pieh, Seoul (KR); Yoonheung Tak, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 107 days.

(21) Appl. No.: 13/727,273

(22) Filed: Dec. 26, 2012

(65) Prior Publication Data
US 2014/0084256 A1    Mar. 27, 2014

(30) Foreign Application Priority Data
Sep. 26, 2012  (KR) .................. 10-2012-0107004

(51) Int. Cl.
*H01L 51/50* (2006.01)
*H01L 51/56* (2006.01)

(52) U.S. Cl.
CPC .......... *H01L 51/504* (2013.01); *H01L 51/5088* (2013.01); *H01L 51/5092* (2013.01); *H01L 51/56* (2013.01); *H01L 51/5072* (2013.01); *H01L 51/5056* (2013.01)
USPC ............................................. 257/40; 438/82

(58) Field of Classification Search
USPC .......................................................... 257/40
See application file for complete search history.

(56) References Cited

U.S. PATENT DOCUMENTS

| | | | | |
|---|---|---|---|---|
| 6,661,029 B1* | 12/2003 | Duggal | | 257/89 |
| 6,835,953 B2* | 12/2004 | Cok et al. | | 257/59 |
| 6,841,949 B2* | 1/2005 | Duggal | | 315/169.3 |
| 7,557,494 B2* | 7/2009 | Adachi | | 313/112 |
| 2011/0140597 A1* | 6/2011 | Lee et al. | | 313/506 |
| 2013/0328021 A1* | 12/2013 | Lim et al. | | 257/40 |

* cited by examiner

*Primary Examiner* — Thao P Le
(74) *Attorney, Agent, or Firm* — Fenwick & West LLP

(57) ABSTRACT

An organic light emitting diode device and a method for manufacturing the same are disclosed. The organic light emitting diode device including a substrate, stacks disposed between a first electrode and a second electrode on the substrate, wherein the stacks including a first stack having a first blue layer and a second stack disposed on the first stack and having a second blue layer, and a first emission layer is formed at a partial region of the first stack, and a second emission layer is formed at a partial region of the second stack.

20 Claims, 12 Drawing Sheets

ORGANIC LIGHT EMITTING DIODE DEVICE AND METHOD OF MANUFACTURING THE SAME

This application claims the benefit of Korean Patent Application No. 10-2012-0107004 filed on Sep. 26, 2012, which is incorporated herein by reference for all purposes as if fully set forth herein.

BACKGROUND OF INVENTION

1. Field of the Invention

This document relates to an organic light emitting diode device, and more particularly, to an organic light emitting diode device capable of simplifying a process and improving luminous efficiency.

2. Discussion of the Related Art

In recent years, with the development of multi-media, the importance of a flat panel display (FPD) has been increased. To satisfy the demand, various displays such as a liquid crystal display (LCD), a plasma display panel (PDP), a field emission display (FED), and an organic light emitting diode device have been put to practical use.

Particularly, the organic light emitting diode device is a self-emissive device which represents fast response speed of 1 millisecond (ms) or less and low power consumption. Further, since the organic light emitting diode device has an excellent viewing angle, the organic light emitting diode device is beneficial as a moving picture display medium regardless of the size of a device. In addition, since the organic light emitting diode device may be manufactured at a low temperature and a manufacturing process thereof is simple based on an existing semiconductor process technique, it is spotlighted as a next-generation flat panel display.

The organic light emitting diode device includes a cathode, an anode and an organic emission layer interposed between the cathode and the anode. An electron provided from the cathode is combined with a hole provided from the anode at the emission layer to form an exciton. The exciton is transited into a ground state from an excited state, thereby emitting light.

The organic light emitting diode device has been developed as various structures. Among them, a white organic light emitting diode device has been developed as a stack structure of a red emission layer, a green emission layer, and a blue emission layer or a stack structure of a yellow-green layer and a blue emission layer. However, the white organic light emitting diode device represents low color purity and a high driving voltage and in which productivity is reduced.

SUMMARY OF THE INVENTION

The present invention has been made in an effort to provide an organic light emitting diode device capable of simplifying a process, improving luminous efficiency, and reducing power consumption.

In one aspect, there is an organic light emitting diode device including a substrate, stacks disposed between a first electrode and a second electrode on the substrate, wherein the stacks including a first stack having a first blue layer and a second stack disposed on the first stack and having a second blue layer, and a first emission layer is formed at a partial region of the first stack, and a second emission layer is formed at a partial region of the second stack.

In another aspect, there is a method of manufacturing an organic light emitting diode device including forming a first electrode on a substrate, forming a first stack including forming a first emission layer on the substrate on which the first electrode is formed using a first mask, and forming a first blue layer on the first emission layer using a second mask, forming a second stack including forming a second emission layer on the substrate on which the first stack is formed using the first mask, and forming a second blue layer on the first emission layer using the second mask, and forming a second electrode on the substrate on which the second stack is formed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to embodiments of the invention, examples of which are illustrated in the accompanying drawings. Wherever possible, the same reference numbers will be used throughout the drawings to refer to the same or like parts.

Figure 1:
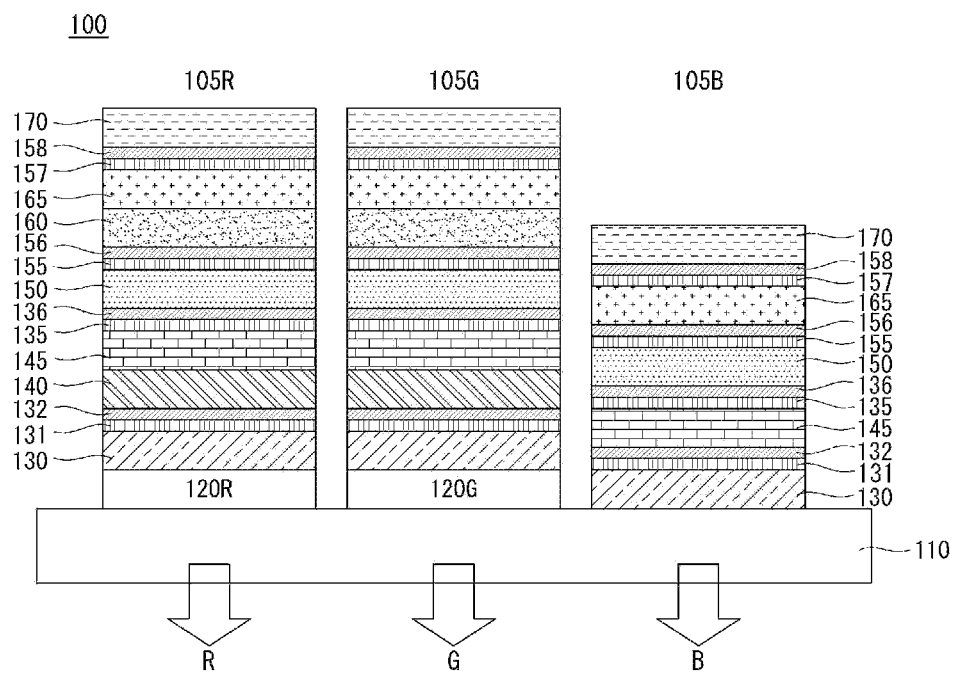
FIG. 1 is a view illustrating an organic light emitting diode device according to an exemplary embodiment of the present invention.

FIG. 1 is a view illustrating an organic light emitting diode device according to an exemplary embodiment of the present invention.

Referring to FIG. 1, an organic light emitting diode device 100 according to the first embodiment of the present invention may be an organic light emitting diode device which emits light of red, green, and blue wavelengths. In the first embodiment of the present invention, three sub-pixels constitute one unit pixel. Each pixel includes a red emission part 105R emitting red light, a green emission part 105G emitting green light, and a blue emission part 105B emitting blue light, so that the pixel as a whole provides a full range of colors.

The organic light emitting diode device 100 according to the first embodiment of the present invention includes stacks ST disposed on a substrate 110, disposed between a first electrode 130 and a second electrode 170. The stacks ST include a first stack 1ST having a first blue layer 145 and a second stack 2ST disposed on the first stack 1ST and having a second blue layer 165.

In detail, the substrate 110 may be made of transparent glass or plastic or a conductive material in which light can transmit. A red color filter 120R and a green color filter 120G are disposed on the substrate 110, a red color filter 120R is disposed at the red emission part 105R, and the green color filter 120G is disposed at the green emission part 105G. The red color filter 120R and the green color filter 120G function to transmit lights of red and green wavelengths in mixed light of green and red colors, respectively. The first electrode 130 is a transparent anode and is made of one of indium tin oxide (ITO), indium zinc oxide (IZO), or zinc oxide (ZnO).

The first stack 1ST constitutes one light emitting device unit, and includes a first blue layer 145. In detail, the red emission part 105R and the green emission part 105G include a first emission layer 140. A first blue layer 145 is commonly formed at the red emission part 105R, the green emission part 105G, and the blue emission part 105B. The first emission layer 140 is not formed at the blue emission part 105B.

The first emission layer 140 emits red or green light. For example, when the first emission layer 140 emits green light, the first emission layer 140 may be formed by doping one host selected from CBP(4,4'-N,N'-dicarbazolebiphenyl) and Balq (Bis(2-methyl-8-quinlinolato-N1,O8)-(1,1'-Biphenyl-4-olato)aluminium) with a green phosphoresce dopant. When the first emission layer 140 emits red light, the first emission layer 140 is formed by doping one host selected from CBP (4,4'-N,N'-dicarbazolebiphenyl) and Balq(Bis(2-methyl-8-quinlinolato-N1,O8)-(1,1'-Biphenyl-4-olato)aluminium) with at least one red phosphoresce dopant selected from Ir(M-npy)3, Btp2Ir(acac)(bis(2O-benzo[4,5-a]thienyl)pyridinato-N,C3O)iridium(zcetylactonate), and Btp2Ir(acac)(iridium (III)bis(1-phenylisoquinolyl)-N,C2') acetyl.

A first blue layer 145 is disposed on the first emission layer 140 of the red emission part 105R and the green emission part 105G, and a first blue layer 145 is commonly disposed at the blue emission part 105B. For example, the first blue layer 145 is formed by doping a host material of AND(9,10-di(2-naphthyl)anthracene) or DPVBi(4,4'-bis(2,2-diphenylethen-1-yl)-diphenyl) with a blue fluorescent dopant of 1,6-Bis(diphenylamine)pyrene, TBPe(tetrakis(t-butyl)perylene), or 4'-N, N-diphenylaminostyryl-triphenyl(DPA-TP), a deep blue dopant of 2,5,2',5'-tetrastyryl-biphenyl (TSB) or anthrancene derivative, p-bis(p-N,N-diphenyl-aminostylrl)benzene or phenylcyclopentadiene.

A first blue layer 145 is disposed on a first emission layer 140 of the red emission part 105R and the green emission part 105G, and the first blue layer 145 is commonly disposed at the blue emission part 105B. In the first blue layer 145 of the blue emission part 105B, energy of a host is transited into a dopant so that blue light is emitted. However, in the first blue layer 145 of the red and green emission parts 105R and 105G, energy of a host is not transited into a dopant but is transited into a dopant of the first emission layer 140 having smaller energy level difference so that the first blue layer 145 does not emit light but instead transfers the energy.

The first stack 1ST further includes a first hole injection layer (HIL) 131 and a first hole transport layer (HTL) 132 formed between the first electrode 130 and the first emission layer 140. The first hole injection layer 131 injects holes from the first electrode 130 to the first emission layer 140. The first hole injection layer 131 may be made of at least one selected from the group consisting of cupper phthalocyanine (CuPc), poly(3,4)-ethylenedioxythiophene (PEDOT), polyaniline (PANI), and N,N-dinaphthyl-N,N'-diphenyl benzidine (NPD), but the present invention is not limited thereto. The first hole injection layer (132) may be made of at least one selected from the group consisting of N,N-dinaphthyl-N,N'-diphenyl benzidine (NPD), N,N'-bis-(3-methylphenyl)-N,N'-bis-(phenyl)-benzidine (TPD), s-TAD, and (4,4',4"-Tris(N-3-methylphenyl-N-phenyl-amino)-triphenylamine (MTDATA), but the present invention is not limited thereto.

The first stack 1ST further includes a first electron transport layer (ETL) 135 and a first electron injection layer (EIL) 136 formed on the first blue layer 145. The first electron transport layer 135 functions to transport electrons. The first electron transport layer 135 may be made of at least one selected from the group consisting of tris(8-hydroxyquinolino)aluminum) (Alq3), PBD, TAZ, Spiro-PBD, BAlq, and SAlq, but the present invention is not limited thereto. The first electron injection layer 136 functions to inject electron, and may use Alq3(tris(8-hydroxyquinolino)aluminum), PBD, TAZ, spiro-PBD, BAlq, or SAlq, but the present invention is not limited thereto. The first electron injection layer 136 may further include a metal compound such as alkaline metal or alkaline earth metal.

The first hole injection layer 131, the first hole transport layer 132, the first blue layer 145, the first electron transport layer 135, and a first electron injection layer 136 on the first electrode 130 constitute a first stack 1ST. A first emission layer 140 is further provided between the first hole transport layer 132 and the first blue layer 145 at the red emission part 105R and the green emission part 105G.

A second stack 2ST is disposed above the first stack 1ST, and includes a second blue layer 165. In detail, the red emission part 105R and the green emission part 105G include a second emission layer 160, and a second blue layer 165 is commonly formed at the red emission part 105R, the green emission part 105G, and the red emission part 105B, but the second emission layer 160 is not formed at the blue emission part 105B.

If the first emission layer 140 is configured to emit one of red light and green light, the second emission layer 160 emits remaining light (i.e., the other color of light). For example, if the first emission layer 140 is a red emission layer for emitting red light, the second emission layer 160 becomes a green emission layer for emitting green light.

The second blue layer 165 has the same configuration as that of the first emission layer 140. The second blue layer 165 is disposed on the second emission layer 160 of the red emission layer 105R and the green emission layer 105G, and the second blue layer 165 is commonly disposed at the blue emission part 105B. In the second blue layer 165 of the red and green emission parts 105R and 105G, energy of a host is transited into a dopant so that blue light is emitted. However, in the second blue layer 165 of the red and green emission parts 105R and 105G, energy of a host is not transited into a dopant but is transited into a dopant of the second emission layer 160 having smaller energy level difference so that the second blue layer 165 does not emit light but instead transfers the energy.

In addition, the second stack 2ST further includes a second HIL 155 and a second hole transport layer 156 between the first stack 1ST and the second emission layer 160, and further includes a second electron transport layer 157 and a second electron injection layer 158 on the second blue layer 165. The second HIL 155, the second hole transport layer 156, the second electron transport layer 157, and the second electron injection layer 158 have the same configurations as those of the first hole injection layer 131, the first hole transport layer 132, the first electron transport layer 135, and the first electron injection layer 136, respectively.

Accordingly, the second hole injection layer 155, the second hole transport layer 156, the second blue layer 165, the second electron transport layer 157, and a second electron injection layer 158 on the first stack 1ST constitute a second stack 2ST. A second emission layer 160 is further provided between the second hole transport layer 156 and the second blue layer 165 at the red emission part 105R and the green emission part 105G.

A charge generation layer (CGL) 150 is disposed between the first stack 1ST and the second stack 2ST. The CGL 150 is a PN junction charge generation layer where a junction is formed between an N type charge generation layer 141 and a P type charge generation layer 142. The CGL 150 generates and injects the charge to the respective emission layers or separately injects a hole and an electron into emission layers formed in the first stack 1ST and the second stack 2ST. That is, the N type CGL supplies an electron to the first emission layer 140 and the first blue layer 145 adjacent to the first electrode 130, and the P type CGL supplies a hole to the second emission layer 160 and the blue layer 165 adjacent to the second electrode 170, so that luminous efficiency of the organic light emitting diode device including a plurality of emission layers and a driving voltage may be reduced.

The P type CGL may be made of metal or an organic material doped with a P type dopant. Here, the metal may include one selected from the group consisting of Al, Cu, Fe, Pb, Zn, Au, Pt, W, In, Mo, Ni, and Ti, and an alloy thereof. Moreover, a P type dopant and a host material used in an organic material doped with the P type dopant may use a generally used material. For example, the P type dopant may be one material selected from the group consisting of 2,3,5,6-tetrafluoro-7,7,8,8-tetracyanoquinodimethane (F4-TCNQ), a derivative of tetracyanoquinodimethane, iodine, FeCl3, FeF3, and SbCl5. Furthermore, the host may be one material selected from the group consisting of N,N'-D(naphthalene-1-1)-N,N-diphenyl-benzidine (NPB), N,N'-diphenyl-N,N'-bis(3-methyphenyl)-1,1-biphenyl-4,4'-diamine (TPD), and N,N',N'-tetranaphthyl-benzidine (TNB).

The P type CGL may be made of metal or an organic material doped with an N type dopant. Here, the metal may include one selected from the group consisting of Li, Na, K, Rb, Cs, Mg, Ca, Sr, Ba, La, Ce, Sm, Eu, Tb, Dy, and Yb. Moreover, an N type dopant and a host material used in an organic material doped with the N type dopant may use a generally used material. For example, the N type dopant may be alkaline metal, alkaline metal compound, alkaline earth metal, or alkaline earth metal compound. In detail, the N type dopant may be one selected from the group consisting of Cs, K, Rb, Mg, Na, Ca, Sr, Eu, and Yb. The host material may be one selected from the group consisting of tris(8-hydroxyquinoline) aluminum, triazine, hydroxyquinoline derivative, benzazole derivative, and xylol derivative.

The second electrode 170 is disposed on the second stack 2ST. The second electrode 170 may be a cathode, and may be made of aluminum (Al), magnesium (Mg), silver (Ag), or an alloy thereof having a low work function.

As described above, in the organic light emitting diode device 100 according to the first embodiment of the present invention, the first blue layer 145 and the second blue layer 165 are commonly provided at the red emission part 105R, the green emission part 105G, and the blue emission part 105B. The first emission layer 140 and the second emission layer 160 for emitting red and green lights are formed at the red emission part 105R, the green emission part 105G, respectively.

Accordingly, red and green lights emitted from the first emission layer 140 and the second emission layer 160 are emitted through the red color filter 120R of the red emission part 105R as red light, and are emitted through the green color filter 120G of the green emission part 105G as green light. In the blue emission part 105B, blue lights emitted from the first blue layer 145 and the second blue layer 165 are emitted through the substrate 110 as it is. Accordingly, the organic light emitting diode device 100 emits red, green, and blue lights in order to provide a full range of colors.

The foregoing embodiment has illustrated that the organic light emitting diode device 100 according to the first embodiment of the present invention does not include a blue color filter at the blue emission part 105B, but the present invention is not limited thereto. The organic light emitting diode device 100 according to the first embodiment of the present invention may further include the blue color filter for color purity of a blue color.

Hereinafter, a method of manufacturing an organic light emitting diode device according to the first embodiment of the present invention will be described. FIGS. 2A to 2E are sectional views illustrating a method of manufacturing an organic light emitting diode device according to a first embodiment of the present invention, and FIGS. 3A and 3B are plan views illustrating a first mask and a second mask, respectively. Materials of constituent elements are described above, and thus a detailed description thereof is omitted.

Figure 2A:
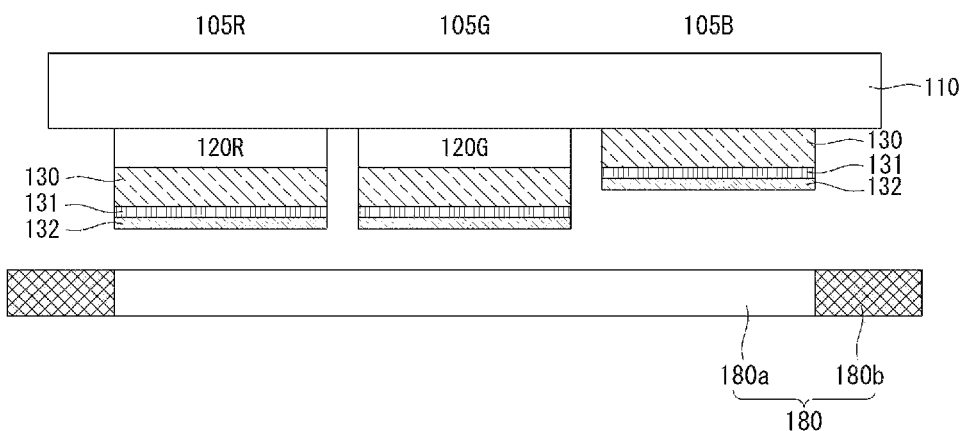
FIGS. 2A to 2E are sectional views illustrating a method of manufacturing an organic light emitting diode device according to a first embodiment of the present invention.
Figure 3A:
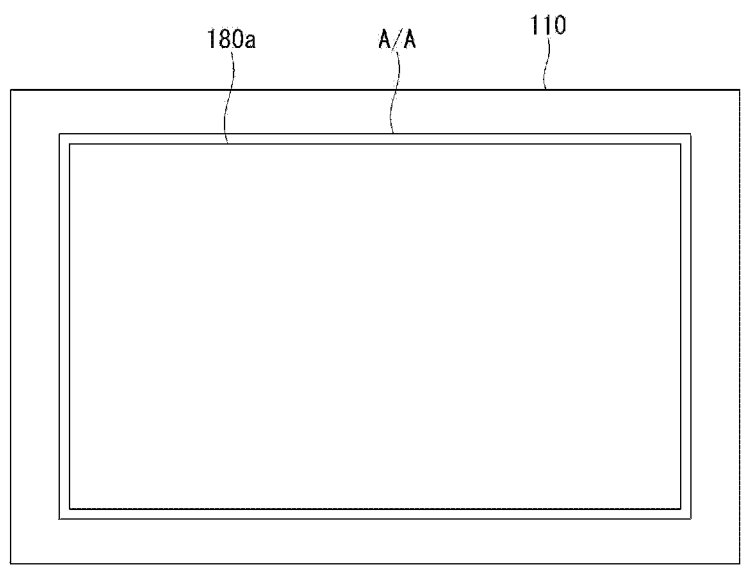
FIGS. 3A and 3B are plan views illustrating a first mask and a second mask, respectively.
Figure 3B:
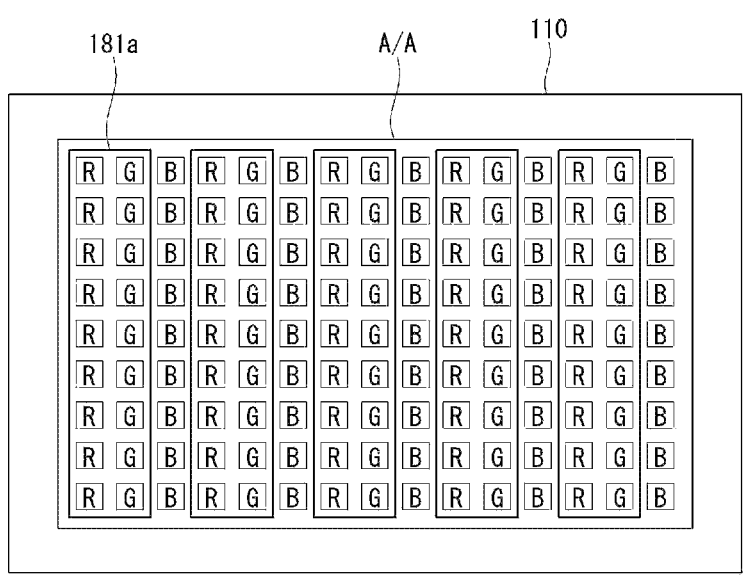

Referring to FIG. 2A, a color filter is formed on the substrate 110. A red color filter 120R is formed at the red emission part 105R, and a green color filter 120G is formed at the green emission part 105R. Although a blue color filter is not formed at the blue emission part 105B in this embodiment, the blue color filter may be formed.

Next, a first electrode 130 is formed for each emission part on a substrate 110 on which the red color filter 120R and the green color filter 120G are formed. The first hole injection layer 131 and the first hole transport layer 132 are sequentially deposited using the first mask 180. Referring to FIG. 3A, in this case, the first mask 180 includes an opening 180a and a blocking part 180b. The opening 180a opens an active area A/A including the red emission part 105R, the green emission part 105G, and the blue emission part 105B, and displaying an image. Accordingly, the first hole injection layer 131 and the first hole transport layer 132 are formed at the red emission part 105R, the green emission part 105G, and the blue emission part 105B all over.

Figure 2B:
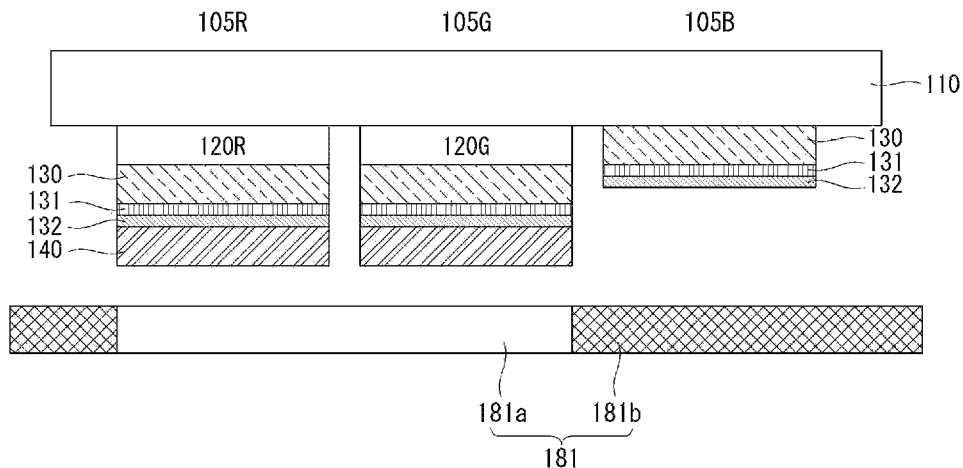

After that, referring to FIG. 2B, the first emission layer 140 is formed at the red emission part 105R and the green emission part 105G on the substrate 110 using the second mask 181. Referring to FIG. 3B, in this case, the second mask 181 includes an opening 181a and a blocking part 181b. The opening 181a opens only a region corresponding to the red emission part 105R and the green emission part 105G among the active area A/A and the blocking part 181b blocks a region corresponding to the blue emission part 105B. Accordingly, the first emission layer 140 is formed only at the red emission part 105R and the green emission part 105G. The first emission layer 140 is formed by a material emitting red or green light.

Figure 2C:
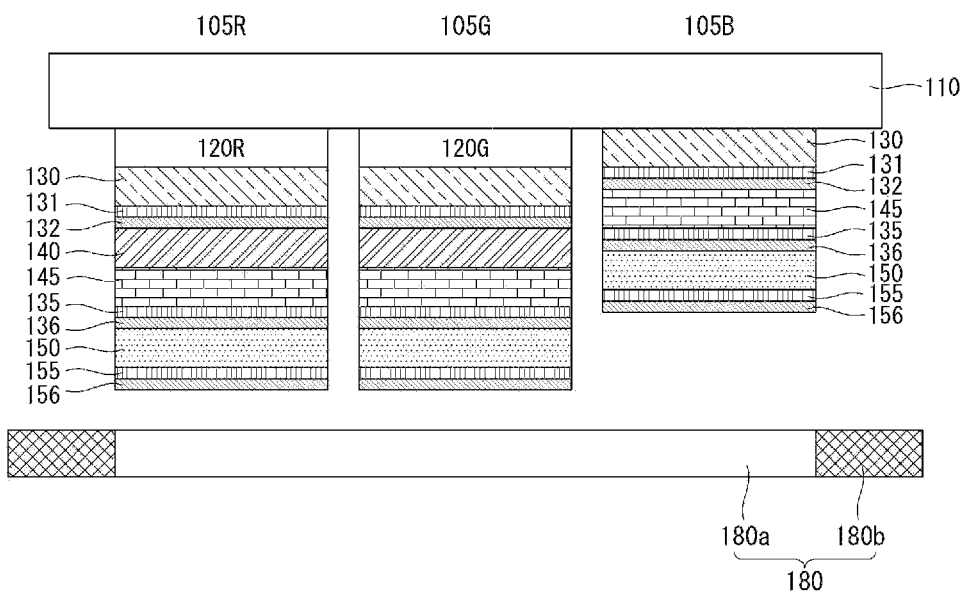

Next, referring to FIG. 2C, the first blue layer 145, the first electron transport layer 135, the first electron injection layer 136, the CGL 150, the second hole injection layer 155, and the second hole transport layer 156 are sequentially deposited on an entire part of the active area A/A using the first mask 180. The blue layer 145 is formed by a material emitting blue light.

Figure 2D:
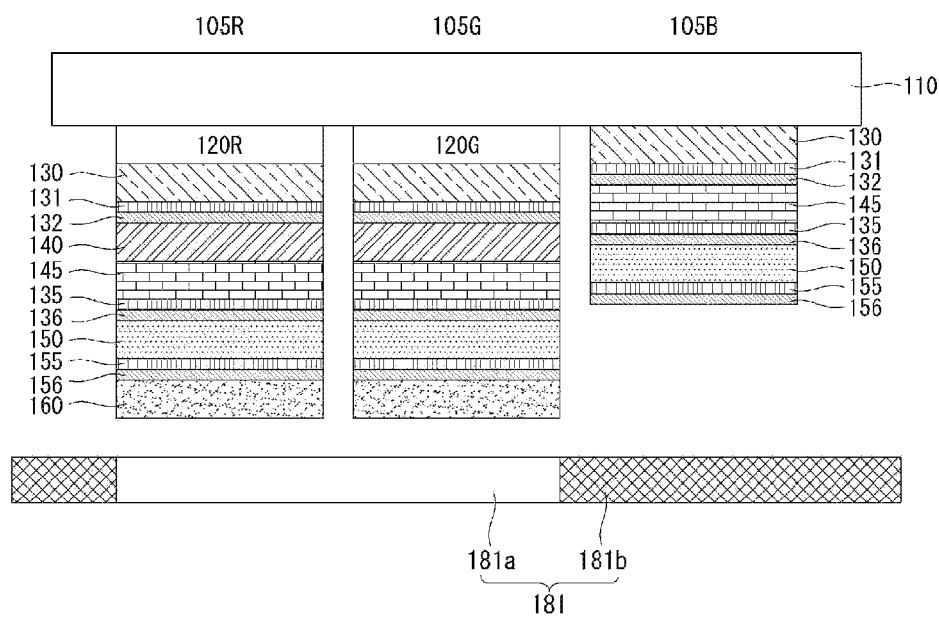

Subsequently, referring to FIG. 2D, the second emission layer 160 is formed at the red emission part 105R and the green emission part 105G on the substrate 110 using the second mask 181. Since the opening 181a of the second mask 181 opens a region corresponding to the red emission part 105R and the green emission part 105G in the active area A/A and the blocking part 181b blocks a region corresponding to the blue emission part 105B, the second emission layer 160 is formed only at the red emission part 105R and the green emission part 105G. The second emission layer 160 is formed by a remaining material except for an emission material of the first emission layer 140 of a material emitting a red light and a material emitting a green light. For example, if the first emission layer 140 is formed by the material emitting the red light, the second emission layer 160 is formed by the material emitting the green light.

Figure 2E:
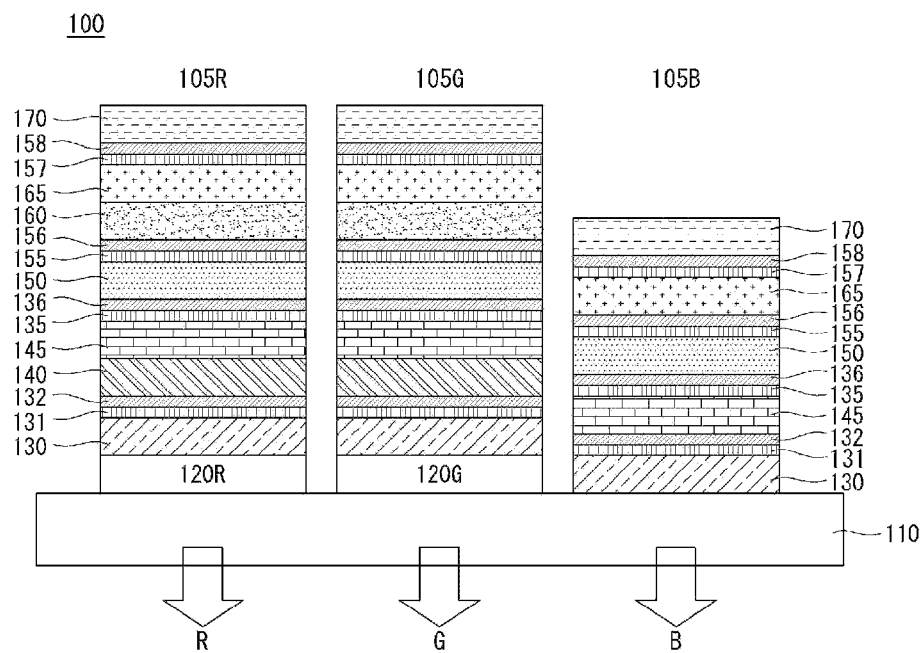

Finally, referring to FIG. 2E, the organic light emitting diode device 100 according to the first embodiment of the present invention is manufactured by sequentially depositing the second blue layer 165, the second electron transport layer 157, the second electron injection layer 158, and the second electrode 170 on the substrate 110 using the first mask 180.

As described above, in the organic light emitting diode device according to the first embodiment of the present invention, since a first emission layer and a second emission layer are laminated using a mask simultaneously opening a red emission part and a green emission part, and a blue emission layer is formed as a common layer, one is reduced from three shadow masks used to prepare red, green, and blue emission layers according to the related art so that a manufacturing cost can be reduced and a process can be simplified.

Further, since pitches of openings in shadow masks formed at red, green, and blue emission layers used in a method of manufacturing an organic light emitting diode device are designed suited to a pitch of one emission part, a pitch of an opening in the mask is narrow. Thus, failure frequently occurs during deposition and align accuracy is lowered which deteriorates in mass production. On the contrary, in the method of manufacturing the organic light emitting diode device, since emission layers are formed at red and green emission parts using a mask simultaneously opening the red and green emission parts, respectively, a pitch of an opening in the mask is widened so that failure is reduced during deposition and mass production is improved.

Figure 4:
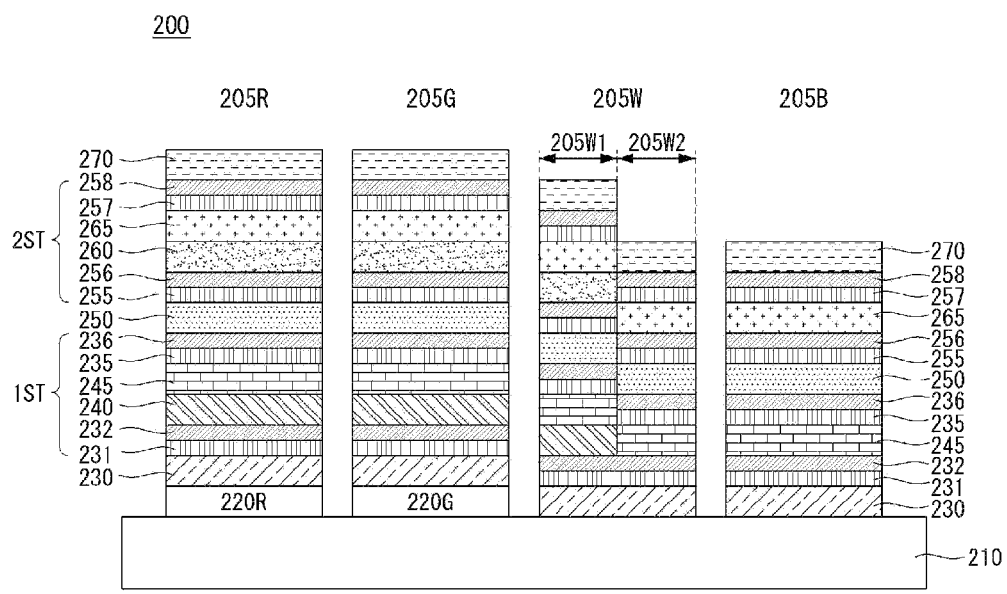
FIG. 4 is a sectional view illustrating an organic light emitting diode device according to a second embodiment of the present invention.

The organic light emitting diode device of the present invention may emit red, green, blue, and white lights in order to provide a full range of colors. FIG. 4 is a sectional view illustrating an organic light emitting diode device according to a second embodiment of the present invention. Hereinafter, the same configuration as that of the first embodiment is schematically described.

Referring to FIG. 4, an organic light emitting diode device 200 according to the second embodiment of the present invention may be an organic light emitting diode device which emits light of red, green, blue, and white wavelengths. In the second embodiment of the present invention, four sub-pixels constitute one unit pixel. Each pixel includes a red emission part 205R emitting red light, a green emission part 205G emitting green light, a blue emission part 205B emitting blue light, and a white emission part 205W emitting white light, so that the pixel as a whole provides a full range of colors.

The organic light emitting diode device 200 according to the second embodiment of the present invention includes stacks ST disposed on a substrate 110 between a first electrode 230 and a second electrode 270. The stacks ST include a first stack 1ST having a first blue layer 245 and a second stack 2ST disposed on the first stack 1ST and having a second blue layer 265.

In detail, a red color filter 220R and a green color filter 220G are disposed on the substrate 210, a red color filter 220R is disposed at the red emission part 205R, and the green color filter 220G is disposed at the green emission part 205G.

The first stack 1ST constitutes one light emitting device unit, and includes a first blue layer 245. In detail, the red emission part 205R, the green emission part 205G, and the first white emission part 205W1 include a first emission layer 240. A first blue layer 245 is commonly formed at the red emission part 205R, the green emission part 205R, the blue emission part 205B, and the first white emission part 205W1. The first emission layer 240 is not formed at the blue emission part 105B and a second white emission part 205W2. In the white emission part 205W, a region at which the first emission layer 240 is formed is defined as the first white emission part 205W1, and a region at which the first emission layer 240 is not formed is defined as the second white emission part 205W2.

The first emission layer 240 emits red or green light. A first blue layer 245 is disposed on the first emission layer 240 of the red emission part 205R, the green emission part 205G, and the first white emission part 205W1, and the first blue layer 245 is commonly formed at the second white emission part 205W2 and the blue emission part 205B.

In the first blue layer 245 of the blue emission part 205B and the second white emission part 205W2, energy of a host is transited into a dopant so that blue light is emitted. However, in the first blue layer 245 of the red emission part 205R, the green emission part 205G, and the first white emission part 205W1, energy of a host is not transited into a dopant but is transited into a dopant of the first emission layer 240 having smaller energy level difference so that the first blue layer 245 does not emit light but instead transfers the energy.

The first stack 1ST further includes a first hole injection layer (HIL) 231 and a first hole transport layer (HTL) 232 formed between the first electrode 230 and the first emission layer 240, and further includes a first electron transport layer (ETL) 235 and a first electron injection layer (EIL) 236 on the first blue layer 245. The first hole injection layer 231, the first hole transport layer 232, the first blue layer 245, the first electron transport layer 235, and a first electron injection layer 236 on the first electrode 230 constitute a first stack 1ST. A first emission layer 240 is further provided between the first hole transport layer 232 and the first blue layer 245 at the red emission part 205R, the green emission part 205G, and the first white emission part 205W1.

A second stack 2ST is disposed above the first stack 1ST, and includes a second blue layer 265. In detail, the red emission part 205R, the green emission part 205G, and the first white emission part 205W1 include a second emission layer 260, but the second emission layer 260 is not formed at the second white emission part 205W2 and the blue emission layer 205B. A second blue layer 265 is commonly formed at the red emission part 205R, the green emission part 205G, the red emission part 205B, and the white emission part 205W.

If the first emission layer 240 is configured to emit one of red light and green light, the second emission layer 260 emits remaining light. For example, if the first emission layer 240 is a red emission layer for emitting red light, the second emission layer 260 becomes a green emission layer for emitting green light. The second blue layer 265 has the same configuration as that of the first emission layer 240.

In addition, the second stack 2ST further includes a second hole injection layer 255 and a second hole transport layer 256 between the first stack 1ST and the second emission layer 260, and further includes a second electron transport layer 257 and a second electron injection layer 258 on the second blue layer 265. Accordingly, the second hole injection layer 255, the second hole transport layer 256, the second blue layer 265, the second electron transport layer 257, and a second electron injection layer 258 on the first stack 1ST constitute a second stack 2ST. A second emission layer 260 is further provided at the red emission part 205R, the green emission part 205G, and the first white emission part 205W1 between the second hole transport layer 256 and the second blue layer 265. Further, a charge generation layer 250 is disposed between the first stack 1ST and the second stack 2ST, and the second electrode 270 is disposed on the second stack 2ST.

As described above, in the organic light emitting diode device 200 according to the second embodiment of the present invention, the first blue layer 245 and the second blue layer 265 are commonly provided at the red emission part 205R, the green emission part 205G, the blue emission part 205B, and the white emission part 205W. The first emission layer 240 and the second emission layer 260 for simultaneously emitting red and green lights are formed at only the red emission part 205R, the green emission part 205G, and the first white emission part 205W1.

Accordingly, red and green lights emitted from the first emission layer 240 and the second emission layer 260 are emitted through the red color filter 220R of the red emission part 205R as red light, and are emitted through the green color filter 220G of the green emission part 205G as green light. In the second white emission part 205W2 and the blue emission part 205B, blue lights emitted from the first blue layer 245 and the second blue layer 265 are emitted through the substrate 110 as it is. The red and green lights from the first emission layer 240 and the second emission layer 260 are emitted to the substrate 210, and are mixed with blue light of the second white emission part 205W2 so that white light is emitted from the white emission layer 205W. Accordingly, the organic light emitting diode device 200 according to the second embodiment of the present invention emits red, green, blue, and white lights in order to provide a full range of colors.

When a color temperature of white light emitted from the white emission part is the same as a target color temperature of a panel, it is beneficial in terms of a design of the panel and power consumption. A color temperature of white light emitted from the white emission part may be controlled by adjusting an area of a first white emission part emitting red and green lights of the first emission layer and the second emission layer, and an area of the second white emission part emitting blue light of the first and second blue layers. For example, to emit white light of a high color temperature, an area of the second white emission part emitting the blue light may be increased. On the contrary, to emit white light of a low color temperature, a target color temperature may be achieved by increasing an area of the first white emission part emitting the red and green lights.

The foregoing embodiment has illustrated that the organic light emitting diode device 200 according to the second embodiment of the present invention does not include a blue color filter at the blue emission part 205B, but the present invention is not limited thereto. The organic light emitting diode device 200 according to the second embodiment of the present invention may further include the blue color filter for color purity of a blue color.

Hereinafter, a method of manufacturing an organic light emitting diode device according to the second embodiment of the present invention will be described. FIGS. 5A to 5E are sectional views illustrating a method of manufacturing an organic light emitting diode device according to the second embodiment of the present invention, and FIGS. 6A and 6B are plan views illustrating a first mask and a second mask, respectively. Materials of constituent elements were described above, and thus a detailed description thereof is omitted.

Figure 5A:
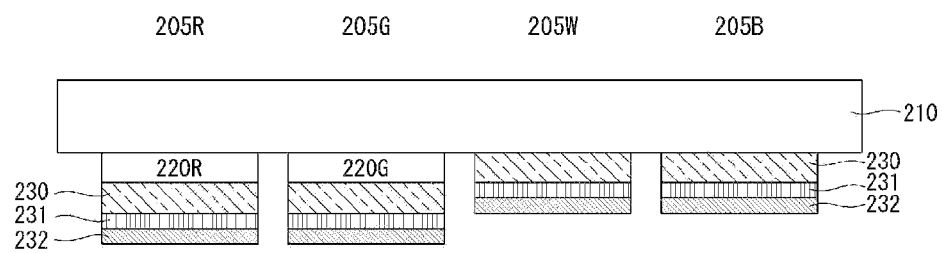
FIGS. 5A to 5E are sectional views illustrating a method of manufacturing an organic light emitting diode device according to the second embodiment of the present invention.
Figure 6A:
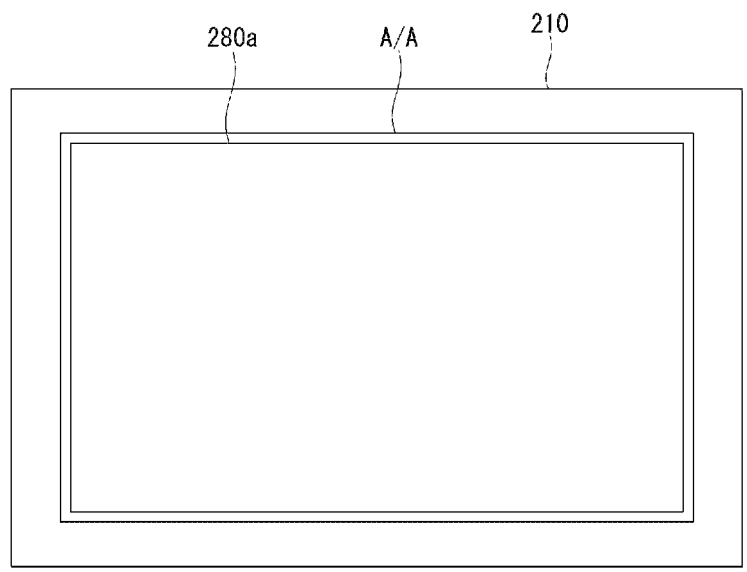
FIGS. 6A and 6B are plan views illustrating a first mask and a second mask, respectively.
Figure 6B:
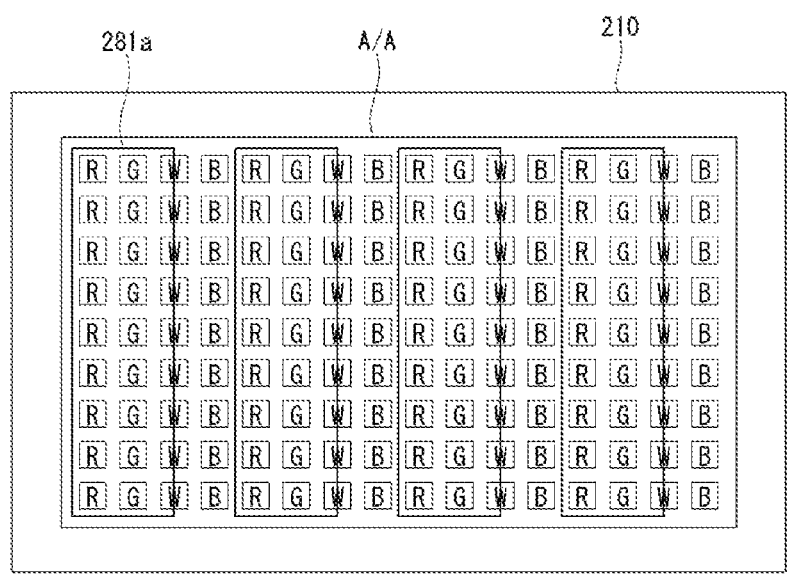

Referring to FIG. 5A, a color filter is formed on the substrate 210. A red color filter 220R is formed at the red emission part 205R, and a green color filter 220G is formed at the green emission part 205R. Although a blue color filter is not formed at the blue emission part 205B in this embodiment, the blue color filter may be formed at the blue emission part 205B.

Next, a first electrode 230 is formed for each emission part on a substrate 210 on which the red color filter 220R and the green color filter 220G are formed. The first hole injection layer 231 and the first hole transport layer 232 are sequentially deposited using the first mask 180. Referring to FIG. 6A, in this case, and opening 280a opens an active area A/A including the red emission part 205R, the green emission part 205G, the blue emission part 205B, and the white emission part 205W, and displaying an image. Accordingly, the first hole injection layer 231 and the first HTL 232 are formed at the red emission part 205R, the green emission part 205G, and the blue emission part 105B all over.

Figure 5B:
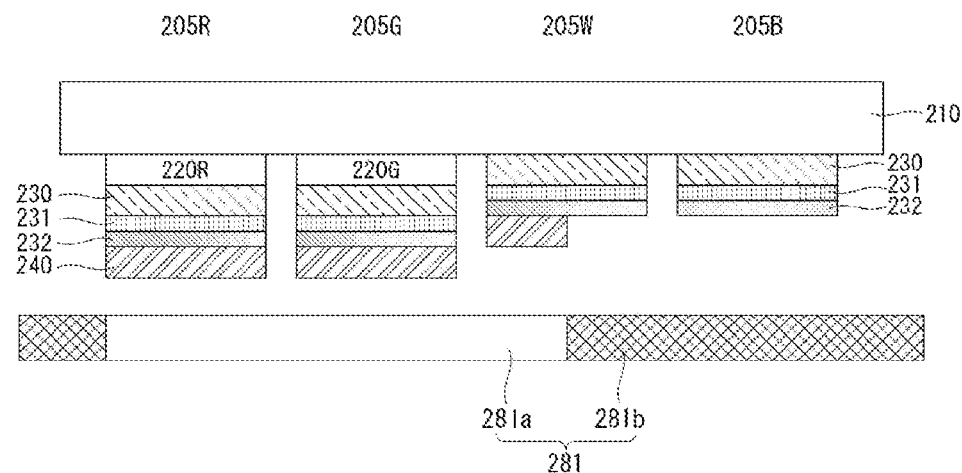

After that, referring to FIG. 5B, the first emission layer 240 is formed at the red emission part 205R, the green emission part 205G, and the first white emission part 205W1 on the substrate 210 using the second mask 281. Referring to FIG. 6B, in this case, the second mask 281 is a shadow mask and includes an opening 281a and a blocking part 281b. The opening 281a opens only a region corresponding to the red emission part 205R, the green emission part 205G, and the first white emission part 205W1 among the active area A/A and the blocking part 181b blocks a region corresponding to the second white emission part 205W2 and the blue emission part 205B. Accordingly, the first emission layer 240 is formed only at the red emission part 205R, the green emission part 205G, and the first white emission part 205W. The first emission layer 240 is formed by a material emitting red or green light.

Figure 5C:
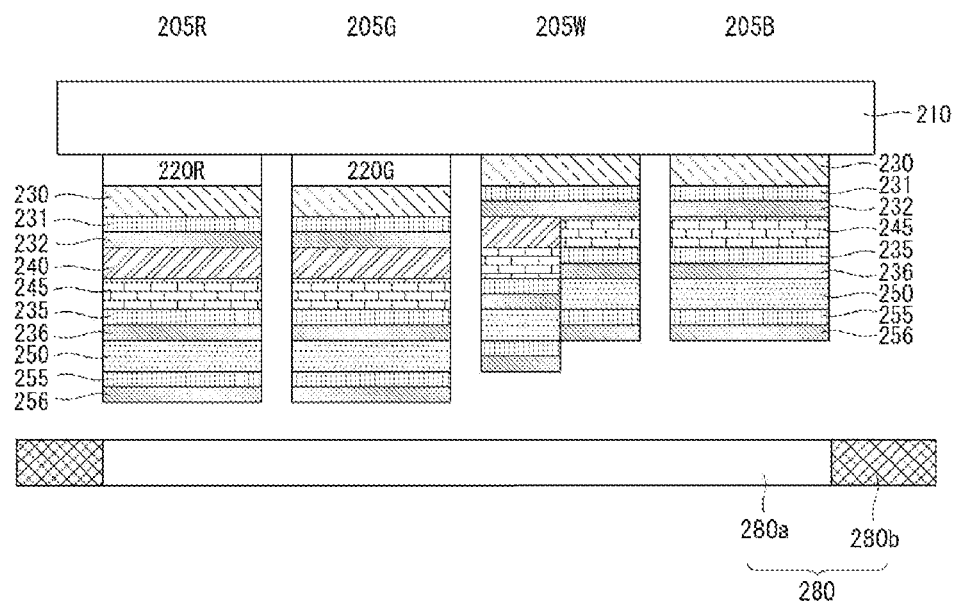

Next, referring to FIG. 5C, the first blue layer 245, the first electron transport layer 235, the first electron injection layer 236, the CGL 250, the second hole injection layer 255, and the second hole transport layer 256 are sequentially deposited on an entire part of the active area A/A using the first mask 280. The blue layer 245 is formed by a material emitting blue light.

Figure 5D:
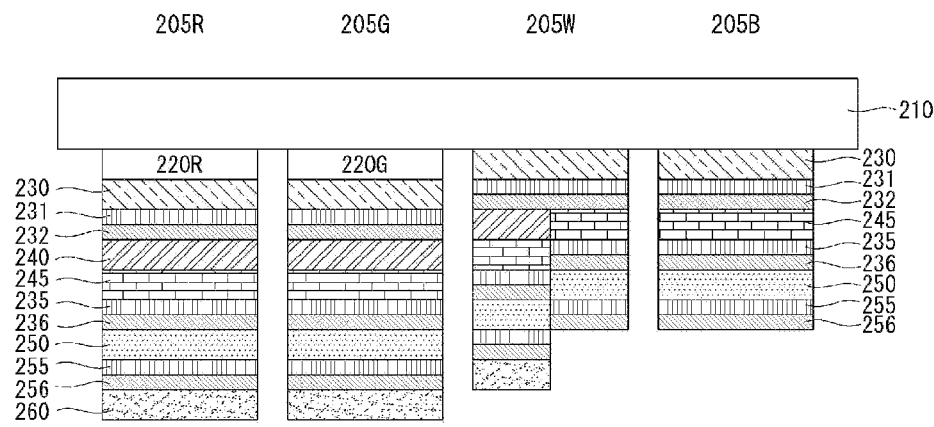

Subsequently, referring to FIG. 5D, the second emission layer 260 is formed at the red emission part 205R, the green emission part 205G, and the first white emission part 205W1 on the substrate 210 using the second mask 281. Since the opening 281a of the second mask 281 opens a region corresponding to the red emission part 205R, the green emission part 205G, and the white emission part 205W1 in the active area A/A, and the blocking part 281b blocks a region corresponding to the second white emission part 205W2 and the blue emission part 205B, the second emission layer 260 is formed only at the red emission part 205R, the green emission part 205G, and the first white emission part 205W1. The second emission layer 260 is formed by a remaining material except for an emission material of the first emission layer 240 of a material emitting a red light and a material emitting a green light. For example, if the first emission layer 240 is formed by the material emitting the red light, the second emission layer 260 is formed by the material emitting the green light.

Figure 5E:
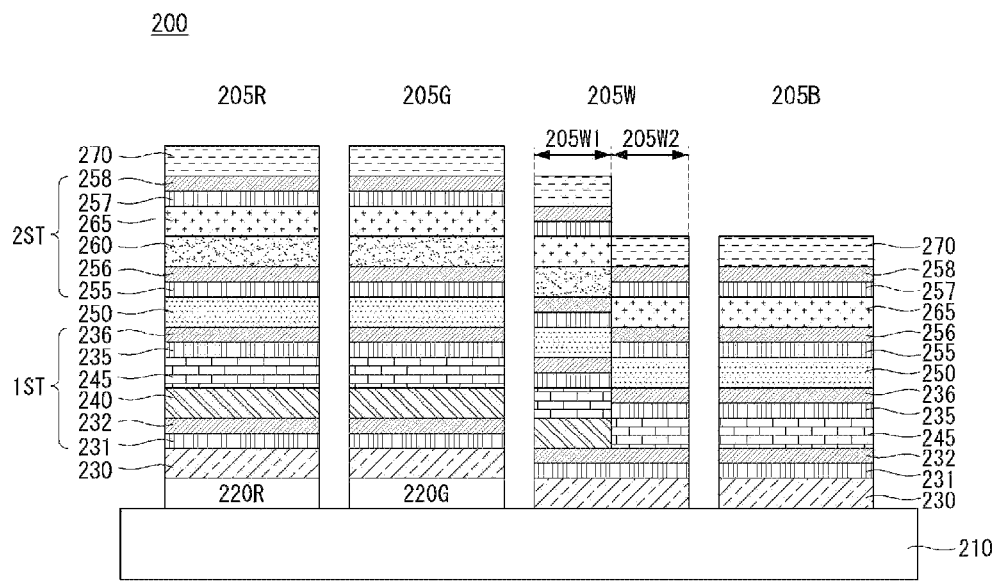

Finally, referring to FIG. 5E, the organic light emitting diode device 200 according to the second embodiment of the present invention is manufactured by sequentially depositing the second blue layer 265, the second electron transport layer 257, the second electron injection layer 258, and the second electrode 270 on the substrate 210 using the first mask 280.

If the first mask 280 is used once during a deposition process, the first mask 280 may not continuously used during a subsequent process, and the subsequent process is performed using a first washed mask having the same size and an opening. In the same manner, the subsequent process is performed using a second washed mask having the same size and opening every time. Further, the first mask 280 is a common mask opening an active area, and the second mask is a shadow mask opening only a specific emission part.

As described above, in the organic light emitting diode device according to the second embodiment of the present invention, since a first emission layer and a second emission layer are laminated using a mask simultaneously opening a red emission part and a green emission part, and a blue emission layer is formed as a common layer, an organic light emitting diode device capable of implementing red, green, blue, and white using two shadow masks. Accordingly, a manufacturing cost of the organic light emitting diode device can be reduced and a process thereof can be simplified.

The present invention provide an organic light emitting diode device capable of implementing red, green, blue, or white by various structures.

Figure 7:
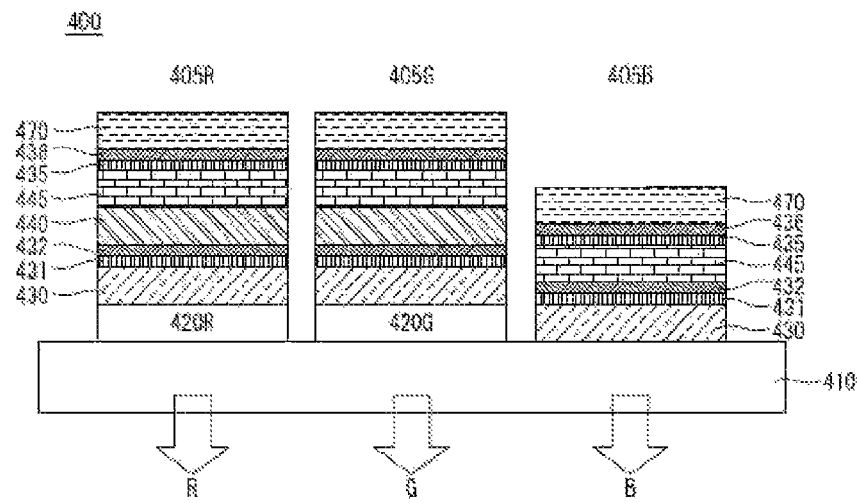
FIG. 7 is a sectional view illustrating an organic light emitting diode device manufactured according to a third embodiment of the present invention.
Figure 8:
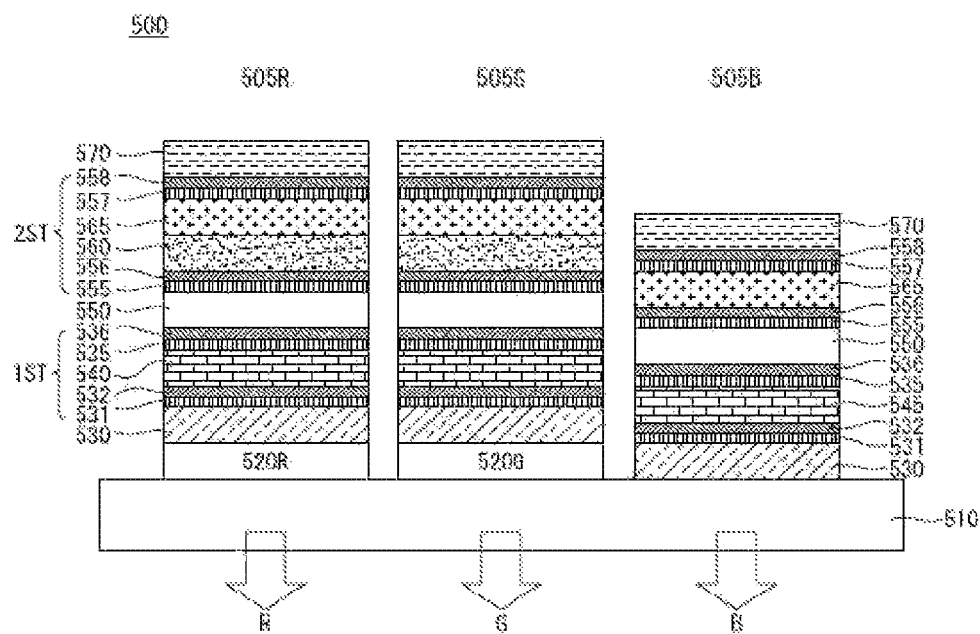
FIG. 8 is a sectional view illustrating an organic light emitting diode device manufactured according to a fourth embodiment of the present invention.
Figure 9:
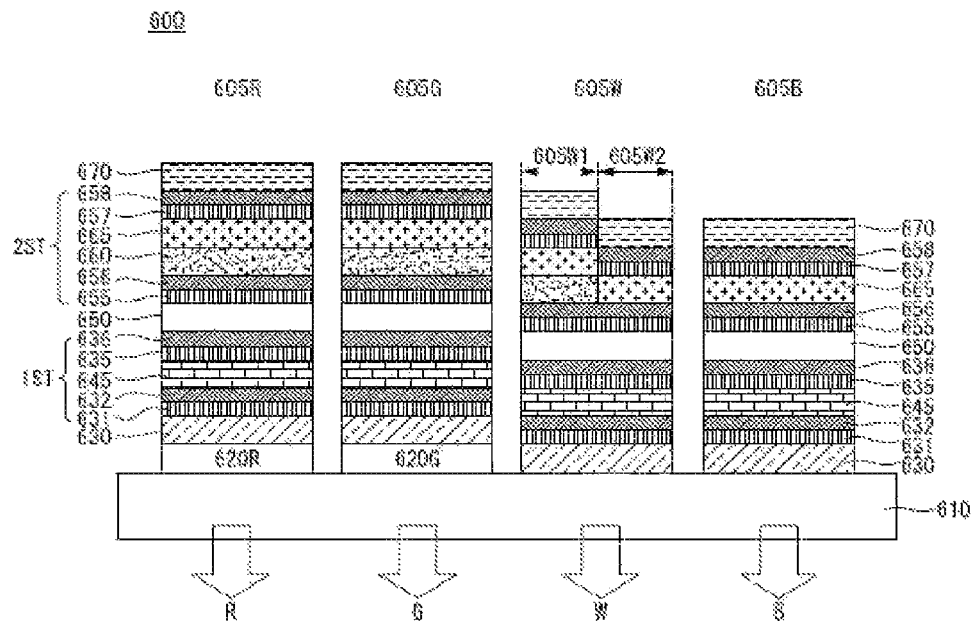
FIG. 9 is a sectional view illustrating an organic light emitting diode device manufactured according to a fifth embodiment of the present invention.

FIG. 7 is a sectional view illustrating an organic light emitting diode device manufactured according to a third embodiment of the present invention, FIG. 8 is a sectional view illustrating an organic light emitting diode device manufactured according to a fourth embodiment of the present invention, and FIG. 9 is a sectional view illustrating an organic light emitting diode device manufactured according to a fifth embodiment of the present invention.

Referring to FIG. 7, an organic light emitting diode device 400 according to the third embodiment of the present invention may be an organic light emitting diode device which emits light of red, green, and blue wavelengths. In the third embodiment of the present invention, three sub-pixels constitute one unit pixel. Each pixel includes a red emission part 405R emitting red light, a green emission part 405G emitting green light, and a blue emission part 405B emitting blue light, so that the pixel as a whole provides a full range of colors.

The organic light emitting diode device 400 according to the third embodiment of the present invention includes a first emission layer 440 and a first blue layer 445 on the substrate 410 between the first electrode 430 and the second electrode 470. In detail, a red color filter 420R and a green color filter 420G are disposed on the substrate 410, the red color filter 420R is disposed at a red emission part 405R, and the green color filter 420G is disposed at a green emission part 405G. A blue emission part 405B emits blue light without a blue color filter.

The red emission part 405R and the green emission part 405G include a first emission layer 440. A first blue layer 445 is commonly formed at the red emission part 405R, the green emission part 405R, and the blue emission part 405B. The first emission layer 440 is formed at the blue emission part 405B.

The first emission layer 440 emits green light together with yellow light. A first blue layer 445 is disposed on a first emission layer 440 of the red emission part 405R and the green emission part 405G, and the first blue layer 445 is commonly disposed at the blue emission part 405B. In the first blue layer 445 of the blue emission part 405B, energy of a host is transited into a dopant so that blue light is emitted. However, in the first blue layer 445 of the red emission part 105R and the green emission part 105G, energy of a host is not transited into a dopant but is transited into a dopant of the first emission layer 440 having smaller energy level difference so that the first blue layer 445 does not emit light but instead transfers the energy.

A first hole injection layer 431 and a first hole transport layer 432 are disposed between the first electrode 430 and the first emission layer 440, and a first electron transport layer 435, a first electron injection layer 436, and a second electrode 470 are disposed on the first blue layer 445. Accordingly, the first hole injection layer 431, the first hole transport layer 432, the first blue layer 445, the first electron transport layer 435, and the first electron injection layer 436 are disposed at the blue emission part 405B. The first emission layer 440 is further provided between the first hole transport layer 432 and the first blue layer 445 at the red emission part 405R and the green emission part 405G.

As described above, in the organic light emitting diode device 200 according to the second embodiment of the present invention, the first blue layer 445 is commonly provided at the red emission part 405R, the green emission part 405G, and the blue emission part 405B. The first emission layer 440 for simultaneously emitting yellow and green lights is formed at only the red emission part 405R and the green emission part 405G.

Accordingly, yellow and green lights emitted from the first emission layer 440 are emitted through the red color filter 420R of the red emission part 405R as red light, and are emitted through the green color filter 420G of the green emission part 405G as green light. In the blue emission part 405B, blue light emitted from the first blue layer 445 is emitted through the substrate 410 as it is. Accordingly, the organic light emitting diode device 400 according to the third embodiment of the present invention emits red, green, and blue lights in order to provide a full range of colors.

Referring to FIG. 8, an organic light emitting diode device 500 according to the fourth embodiment of the present invention may be an organic light emitting diode device which emits light of red, green, and blue wavelengths. In the fourth embodiment of the present invention, three sub-pixels constitute one unit pixel. Each pixel includes a red emission part 505R emitting red light, a green emission part 505G emitting green light, and a blue emission part 505B emitting blue light, so that the pixel as a whole provide a full range of colors.

The organic light emitting diode device 500 according to the fourth embodiment of the present invention includes stacks ST disposed on a substrate 510 between a first electrode 530 and a second electrode 570. The stacks ST include a first stack 1ST including a first blue layer 540 and a second stack 2ST disposed on the first stack 1ST and includes a second blue layer 565.

In detail, a red color filter 520R and a green color filter 520G are disposed on the substrate 510, the red color filter 520R is disposed at the red emission part 505R, and the green color filter 520G is disposed at the green emission part 505G. The first stack 1ST) constitutes one light emitting device unit, and includes a first blue layer 540. In detail, the first blue layer 540 is commonly formed at the read emission part 505R, the green emission part 505G, and the blue emission part 505B.

The first stack 1ST further includes a first hole injection layer 531 and a first hole transport layer 532 formed between the first electrode 530 and the first blue layer 540, and further includes the first electron transport layer 535 and the first electron injection layer 536. Accordingly, the first hole injection layer 531, the first hole transport layer 532, the first blue layer 545, the first electron transport layer 535, and a first electron injection layer 536 on the first electrode 530 constitute a first stack 1ST.

A second stack 2ST is disposed above the first stack 1ST, and includes a second blue layer 565. In detail, the red emission part 505R and the green emission part 505G include a first emission layer 560, and a second blue layer 565 is commonly formed at the red emission part 505R, the green emission part 505G, and the blue emission part 105B, but the first emission layer 560 is not formed at the blue emission part 505B.

The first emission layer 560 simultaneously emits yellow and green lights. A second blue layer 565 is disposed on a first emission layer 560 of the red emission part 505R and the green emission part 505G, and the second blue layer 565 is commonly disposed at the blue emission part 505B. In the second blue layer 565 of the blue emission part 505B, energy of a host is transited into a dopant so that blue light is emitted. However, in the second blue layer 565 of the red emission part 505R and the green emission part 505G, energy of a host is not transited into a dopant but is transited into a dopant of the first emission layer 560 having smaller energy level difference so that the second blue layer 565 does not emit light but instead transfers the energy.

In addition, the second stack 2ST further includes a second hole injection layer 555 and a second hole transport layer 556 between the first stack 1ST and further includes a second electron transport layer 557 and a second electron injection layer 558 on the second blue layer 565. The second hole injection layer 555, the second hole transport layer 556, the second electron transport layer 557, and the second electron injection layer 558 have the same configurations as those of the first hole injection layer 531, the first hole transport layer 532, the first electron transport layer 535, and the first electron injection layer 536, respectively.

Accordingly, the second hole injection layer 555, the second hole transport layer 556, the second blue layer 565, the second electron transport layer 557, and a second electron injection layer 558 on the first stack 1ST constitute a second stack 2ST. A first emission layer 560 is further provided between the second hole transport layer 556 and the second blue layer 565 at the red emission part 505R and the green emission part 505G.

A charge generation layer (CGL) 550 is disposed between the first stack 1ST and the second stack 2ST so that a charge is injected into emission layers formed at the first stack 1ST and the second stack 2ST. A second electrode 570 is disposed on the second stack 2ST.

As described above, in the organic light emitting diode device 500 according to the fourth embodiment of the present invention, a first blue layer 540 and a second blue layer 565 are commonly formed at the red emission part 505R, the green emission part 505G, and the blue emission part 505B. The first emission layer 560 simultaneously emitting yellow and green lights is formed at the red emission part 505R and the green emission part 505G. Accordingly, yellow and green lights from the first emission layer 560 are mixed with blue light from the first blue layer 540 to implement white light.

The white light is emitted through the red color filter 530R of the red emission part 505R as red light, and is emitted through the green color filter 520G of the green emission part 505G as green light. In the blue emission part 505B, blue lights emitted from the first blue layer 540 and the second blue layer 565 are emitted through the substrate 510 as it is. Accordingly, the organic light emitting diode device 500 emits red, green, and blue lights in order to provide a full range of colors.

Referring to FIG. 9, an organic light emitting diode device 600 according to the fifth embodiment of the present invention may be an organic light emitting diode device which emits light of red, green, blue, and white wavelengths. In the fifth embodiment of the present invention, four sub-pixels constitute one unit pixel. Each pixel includes a red emission part 605R emitting red light, a green emission part 605G emitting green light, a blue emission part 605B emitting blue light, and a white emission part 605W emitting white light, so that the pixel as a whole provide a full range of colors.

The organic light emitting diode device 600 according to the fifth embodiment of the present invention includes stacks ST disposed on a substrate 110 between a first electrode 230 and a second electrode 270. The stacks ST include a first stack 1ST having a first blue layer 645 and a second stack 2ST disposed on the first stack 1ST and having a second blue layer 665.

In detail, a red color filter 620R and a green color filter 620G are disposed on the substrate 610, a red color filter 620R is disposed at the red emission part 605R, and the green color filter 620G is disposed at the green emission part 605G. The first stack 1ST constitutes one light emitting device unit, and includes a first blue layer 645. A first blue layer 645 is commonly formed at the red emission part 605R, the green emission part 605R, the blue emission part 605B, and the white emission part 605W. The first blue layer 645 emits blue light to the substrate 610.

The first stack 1ST further includes a first hole injection layer 631 and a first hole transport layer 632 formed between the first electrode 630 and the first blue layer 645, and further includes a first electron transport layer 635 and a first electron injection layer 636 on the first blue layer 245. Accordingly, the first hole injection layer 631, the first hole transport layer 632, the first blue layer 645, the first electron transport layer 635, and a first electron injection layer 636 on the first electrode 630 constitute a first stack 1ST.

A second stack 2ST is disposed above the first stack 1ST, and includes a second blue layer 665. In detail, the red emission part 605R, the green emission part 605G, and the first white emission part 605W1 include a first emission layer 660, but the first emission layer 660 is not formed at the second white emission part 605W2 and the blue emission layer 605B. In the white emission part 605W, a region at which the first emission layer 660 is formed is defined as the first white emission part 605W1, and a region at which the first emission layer 660 is not formed is defined as the second white emission part 605W2. A second blue layer 665 is commonly formed at the red emission part 605R, the green emission part 605R, the blue emission part 605B, and the white emission part 605W.

The first emission layer 660 simultaneously emits yellow and green lights. In the second blue layer 665 of the blue emission part 605B and the second white emission part 605W2, energy of a host is transited into a dopant so that blue light is emitted. However, in the second blue layer 665 of the red emission part 605R, the green emission part 605G, and the first white emission part 605W1, energy of a host is not transited into a dopant but is transited into a dopant of the first emission layer 660 having smaller energy level difference so that the second blue layer 665 does not emit light but transfers the energy.

In addition, the second stack 2ST further includes a second hole injection layer 655 and a second hole transport layer 656 between the first stack 1ST and the second emission layer 660, and further includes a second electron transport layer 657 and a second electron injection layer 658 on the second blue layer 665. Accordingly, the second hole injection layer 655, the second hole transport layer 656, the second blue layer 665, the second electron transport layer 657, and a second electron injection layer 658 on the first stack 1ST constitute a second stack 2ST. A first emission layer 660 is further provided at the red emission part 605R, the green emission part 605G, and the first white emission part 605W1 between the second hole transport layer 656 and the second blue layer 665. Further, a CGL 650 is disposed between the first stack 1ST and the second stack 2ST, and the second electrode 670 is disposed on the second stack 2ST.

As described above, in the organic light emitting diode device 600 according to the fifth embodiment of the present invention, the first blue layer 645 and the second blue layer 665 are commonly provided at the red emission part 605R, the green emission part 605G, the blue emission part 605B, and the white emission part 605W. The first emission layer 660 for simultaneously emitting yellow and green lights is formed at only the red emission part 605R, the green emission part 605G, and the first white emission part 605W1.

Accordingly, yellow and green lights emitted from the first emission layer 660 are mixed with blue light emitted from the first blue layer 645 so that white light is implemented. Accordingly, the white light is emitted through the red color filter 620R of the red emission part 605R as red light, and is emitted through the green color filter 620G of the green emission part 605G as the green light. In the blue emission part 605B, blue lights emitted from the first blue layer 645 and the second blue layer 665 are emitted through the substrate 610 as it is. The yellow and green lights from the first emission layer 660 are emitted to the substrate 610, and are mixed with blue light of the second white emission part 605W2 so that white light is emitted from the white emission part 605W. Accordingly, the organic light emitting diode device 600 according to the fifth embodiment of the present invention emits red, green, blue, and white lights to implement a full color.

Hereinafter, an example of an organic light emitting diode device according to an embodiment of the present invention is disclosed. However, embodiments will be described by way of example only, and the present invention is not limited to following embodiments.

Comparative Example

Figure 10:
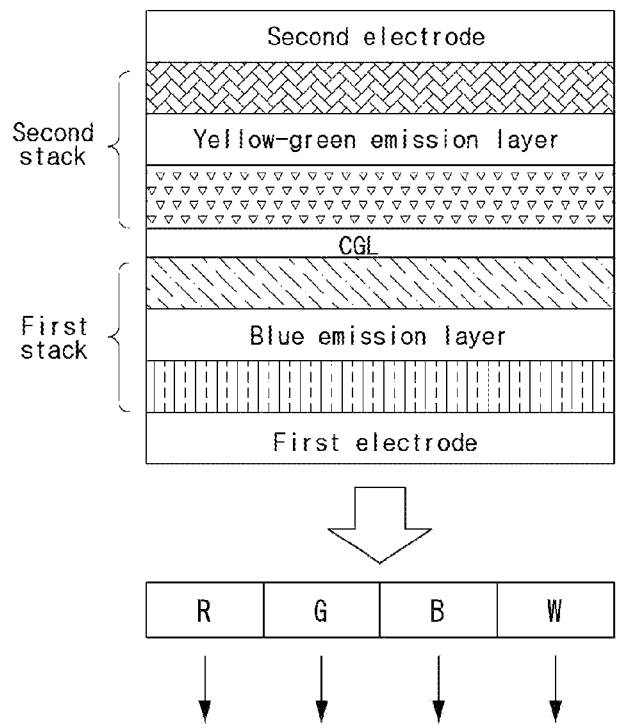
FIG. 10 is a schematic view illustrating an organic light emitting diode device manufactured according to a comparative example of the present invention.

An organic light emitting diode device of a structure shown in FIG. 10 was manufactured by forming first stack including a blue emission layer on a first electrode, forming a CGL on the first stack, laminating a second stack including a yellow-green emission layer, and depositing a second electrode. Each stack includes an hole transport layer, an hole injection layer, an electron transport layer, and an electron injection layer, which are schematically shown in drawings. In the organic light emitting diode device, light emitted from the second stack is mixed with light emitted from the first stack to emit white light, a part of the white light is emitted as it is and is indicated as white, and remaining white light are implemented through R, G, and B color filters as red, green, and blue.

First Example

An organic light emitting diode device of a structure shown in FIG. 7 manufactured according to the third embodiment of the present invention was designed.

Second Example

An organic light emitting diode device of a structure shown in FIG. 8 manufactured according to the fourth embodiment of the present invention was designed.

Third Example

An organic light emitting diode device of a structure shown in FIG. 8 manufactured according to the fourth embodiment of the present invention was designed.

Fourth Example

An organic light emitting diode device of a structure shown in FIG. 1 manufactured according to the first embodiment of the present invention was designed.

After the organic light emitting diode device of the comparative example was manufactured, luminous efficiencies and color coordinates of red, green, blue, and white were measured. Luminous efficiencies and color coordinates according to structures of the first to fourth embodiments were simulated based on data of the comparative example and the simulated luminous efficiencies and color coordinates were listed in a following table 1.

As a simulation condition, efficiency and color coordinates among data of the comparative example applied current level data of a blue mono device. Red and green among data of the comparative example were calculated by equally applying efficiencies and color coordinates of the red and the green of the comparative example based on this. In case of blue, the first embodiment applied a current level of a device, and the second and third embodiments expected efficiency reduction (~6%) due to a cavity effect in data of a blue mono device and then applied double efficiency because of two stacks. Assuming that quantum efficiency EQE of the red and the green is about 23% in a device of the embodiment, efficiencies of the red and the green after application of a color filter were calculated by simulating a spectrum.

Figure 11:
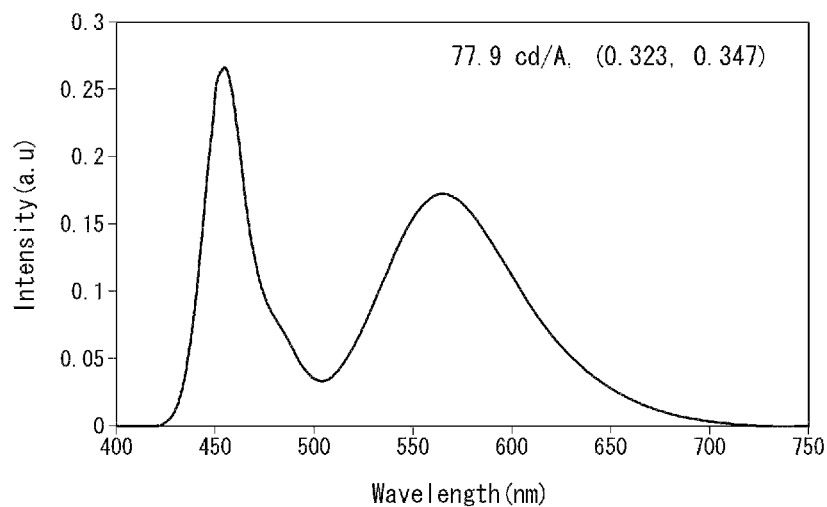
FIG. 11 is a graph illustrating a light spectrum of an organic light emitting diode device according to a comparative example of the present invention.
Figure 12:
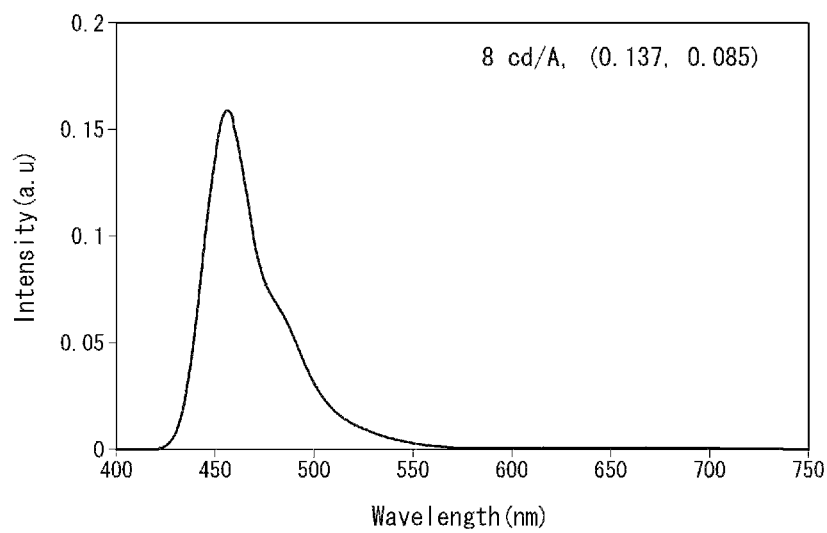
FIG. 12 is a graph illustrating a blue light spectrum of an organic light emitting diode device according to a comparative example of the present invention.
Figure 13:
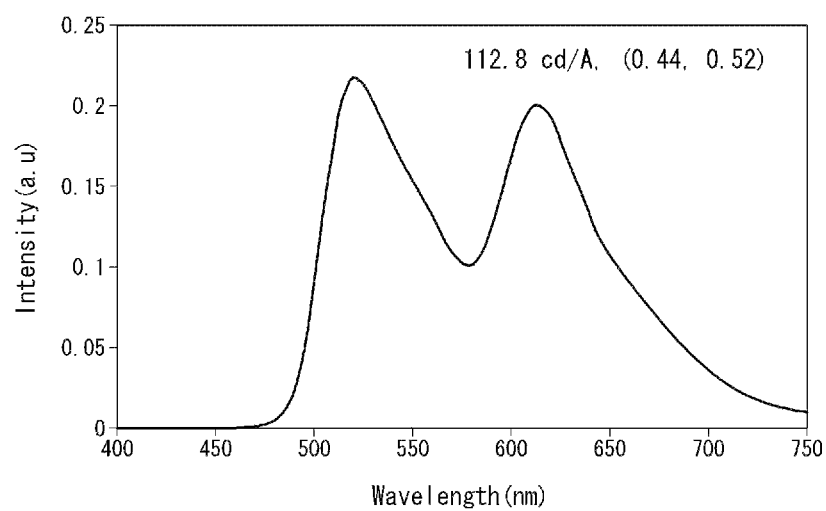
FIG. 13 is a graph illustrating a red and green spectrum of an organic light emitting diode device according to the fourth embodiment of the present invention.

FIG. 11 is a graph illustrating a light spectrum of an organic light emitting diode device according to a comparative example of the present invention, FIG. 12 is a graph illustrating a blue light spectrum of an organic light emitting diode device according to a comparative example of the present invention, and FIG. 13 is graph illustrating a red and green light spectrum of an organic light emitting diode device according to the fourth embodiment of the present invention.

TABLE 1

|     |                             | Comparative example | First example | Second example | Third example | Fourth example |
|-----|-----------------------------|---------------------|---------------|----------------|---------------|----------------|
| Red | Luminous efficiency (cd/A)  | 6.19                | 6.19          | 6.19           | 6.19          | 26.8           |
|     | CIE_x                       | 0.663               | 0.663         | 0.663          | 0.663         | 0.666          |
|     | CIE_y                       | 0.330               | 0.330         | 0.330          | 0.330         | 0.333          |

TABLE 1-continued

|   |   | Comparative example | First example | Second example | Third example | Fourth example |
|---|---|---|---|---|---|---|
| Green | Luminous efficiency (cd/A) | 26.5 | 26.5 | 26.5 | 26.5 | 51.4 |
|   | CIE_x | 0.285 | 0.285 | 0.285 | 0.285 | 0.258 |
|   | CIE_y | 0.659 | 0.659 | 0.659 | 0.659 | 0.681 |
| Blue | Luminous efficiency (cd/A) | 2.76 | 8 | 15 | 15 | 15 |
|   | CIE_x | 0.145 | 0.137 | 0.137 | 0.137 | 0.137 |
|   | CIE_y | 0.047 | 0.085 | 0.085 | 0.085 | 0.085 |
| White | Luminous efficiency (cd/A) | 77.9 | — | — | 77.9 |   |
|   | CIE_x | 0.323 | — | — | 0.347 |   |
|   | CIE_y | 0.3231 | — | — | 0.347 |   |

Referring to the table 1, it may be confirmed that the organic light emitting diode devices manufactured according to first to fourth embodiments of the present invention improves luminous efficiency while representing color coordinates of an equivalent level. Particularly, it may be confirmed that the luminous efficiency of the fourth embodiment can be significantly improved. Peak intensity in a structure of the comparative example in which yellow/green emission layers and a blue emission layer are laminated is high and is clearly separated. It may be confirmed that peak intensity in wavelengths of the green and the red is very lower than that of the present invention shown in FIG. 13. That is, it can be confirmed that color purities of the green and the red in the organic light emitting diode device according to the embodiment is more excellent than that of the comparative example.

Luminous efficiencies, color reproduction ranges, common voltages, and powers are measured and listed in a following table 2. In a case of a comparative example having two stack structures, and second to fourth embodiments, 20V is applied to a common voltage. Since a driving voltage is reduced in the first example having one stack structure, color reproduction ranges, common voltages, and powers were measured by applying 15V.

TABLE 2

|   |   | Color |   | Power |   |
|---|---|---|---|---|---|
|   | (cd/A) | reproduction range (%) (CIE1976) | Common voltage (Vdd, V) | Power consumption (W) | % |
| Comparative Example | 28.5 | 121.1 | 20.0 | 88.8 | 100 |
| First example | 12.4 | 101.3 | 15.0 | 152.2 | 171 |
| Second example | 13.9 | 101.3 | 20.0 | 67.6 | 205 |
| Third example | 37.4 | 101.3 | 20.0 | 67.6 | 76 |
| Fourth example | 32.4 | 105.0 | 20.0 | 78.1 | 88 |

Referring to the table 2, it can be confirmed that color reproduction ranges of organic light emitting diode devices manufactured according to the first to fourth examples of the present invention is lowered as compared with the comparative example, but luminous efficiencies of the third and fourth examples are significantly increased. Power consumption of the third and fourth examples indicated as power is considerably reduced as compared with the comparative example.

That is, it will be appreciated that power consumption is reduced by about 76% and 88% based on 100% of the comparative example.

As mentioned above, in the organic light emitting diode device of the present invention, power consumption characteristics and a luminous efficiency can be improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode device comprising:
a substrate: and
stacks disposed between a first electrode and a second electrode on the substrate,
wherein the stacks including a first stack having a first blue layer and a second stack disposed on the first stack and having a second blue layer, and
a first emission layer is formed at a partial region of the first stack, and a second emission layer is formed at a partial region of the second stack.

2. The organic light emitting diode device of claim 1, wherein the first emission layer emits red or green light, the second emission layer emits light among the red light and the green light except for light emitted from the first emission layer.

3. The organic light emitting diode device of claim 1, wherein the first blue layer and the second blue layer are made of a same material.

4. The organic light emitting diode device of claim 1, wherein the substrate comprises a red emission part emitting red light, a green emission part emitting green light, and a blue emission part emitting blue light, and
the red emission part emits the red light by a red color filter, and the green emission part emit the green light by a green color filter.

5. The organic light emitting diode device of claim 4, wherein the blue emission part emits blue light emitted from the first blue layer and the second blue layer.

6. The organic light emitting diode device of claim 5, wherein the substrate further comprises a white emission part including a first white emission part and a second white emission part, and
the first white emission part has a same structure as structures of the red emission part and the green emission part, and the second white emission part has a same structure as a structure of the blue emission part.

7. The organic light emitting diode device of claim 6, wherein the white emission part mixes blue light emitted from the first blue layer and the second blue layer of the second white emission part with red and green lights emitted from the first emission layer and the second emission layer of the first white emission part to emit white light.

8. The organic light emitting diode device of claim 4, wherein the blue emission part emits blue light by a blue color filter.

9. The organic light emitting diode device of claim 1, further comprising a charge generation layer disposed between the first stack and the second stack.

10. The organic light emitting diode device of claim 1, wherein each of the first stack and the second stack comprises at least one of a hole injection layer, a hole transport layer, an electron transport layer, and an electron injection layer.

11. A method of manufacturing an organic light emitting diode device, the method comprising:
    forming a first electrode on a substrate;
    forming a first stack including forming a first emission layer on the substrate on which the first electrode is formed using a first mask, and forming a first blue layer on the first emission layer using a second mask;
    forming a second stack including forming a second emission layer on the substrate on which the first stack is formed using the first mask, and forming a second blue layer on the first emission layer using the second mask; and
    forming a second electrode on the substrate on which the second stack is formed.

12. The method of claim 11, wherein the first emission layer emits red or green light, the second emission layer emits light among the red light and the green light except for light emitted from the first emission layer.

13. The method of claim 11, wherein the first blue layer and the second blue layer are made of a same material.

14. The method of claim 11, wherein the substrate comprises a red emission part emitting red light, a green emission part emitting green light, and a blue emission part emitting blue light, and
    a red color filter is formed on the substrate corresponding to the red emission part, and a green color filter is formed on the substrate corresponding to the green emission part.

15. The method of claim 14, wherein the substrate further comprises a white emission part including a first white emission part and a second white emission part, and
    further comprising forming a first stack including forming a first emission layer on the substrate on which the first electrode is formed using a third mask opening the red, green, and first white emission parts, and forming a first blue layer using a fourth mask opening the red, green, blue, and white emission parts; and
    forming a second stack including forming a second emission layer on the substrate on which the first stack is formed using the third mask opening the red, green, and first white emission parts, and forming a second blue layer using a fourth mask opening the red, green, blue, and white emission parts.

16. The method of claim 14, further comprising forming a blue color filter on the substrate corresponding to the blue emission part.

17. An organic light emitting diode device comprising:
    a substrate; and
    at least one stack disposed between a first electrode and a second electrode on the substrate,
    the stack includes a first blue layer, and a first emission layer is formed at a partial region of the stack.

18. The organic light emitting diode device of claim 17, wherein the at least one stack comprises a first stack and a second stack disposed at a lower portion of the first stack,
    the first stack comprise the first blue layer, and the first emission layer is formed at a partial region of the first stack, and the second stack comprises a second blue layer.

19. The organic light emitting diode device of claim 18, wherein the first blue layer and the second blue layer are made of a same material.

20. The organic light emitting diode device of claim 19, wherein the first emission layer emit yellow and green lights.

* * * * *